US012777621B2

(12) United States Patent
Fu et al.

(10) Patent No.: US 12,777,621 B2
(45) Date of Patent: Oct. 27, 2026

(54) ELECTRONIC DEVICE COMPRISING RECESS IN BUFFER COMPONENT FOR REMOVING HEAT GENERATED BY ELECTRONIC COMPONENTS

(71) Applicant: HONOR DEVICE CO., LTD., Shenzhen (CN)

(72) Inventors: Guochao Fu, Shenzhen (CN); Yuanru Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 107 days.

(21) Appl. No.: 18/040,075

(22) PCT Filed: Aug. 26, 2022

(86) PCT No.: PCT/CN2022/115243
§ 371 (c)(1),
(2) Date: Jan. 31, 2023

(87) PCT Pub. No.: WO2023/035987
PCT Pub. Date: Mar. 16, 2023

(65) Prior Publication Data

US 2024/0268204 A1 Aug. 8, 2024

(30) Foreign Application Priority Data

Sep. 10, 2021 (CN) ........................ 202111062755.0

(51) Int. Cl.
*H05K 7/20* (2006.01)
*H10K 59/80* (2023.01)
*H10K 59/95* (2023.01)

(52) U.S. Cl.
CPC ..... *H05K 7/20454* (2013.01); *H05K 7/20963* (2013.01); *H10K 59/87* (2023.02); *H10K 59/8794* (2023.02); *H10K 59/95* (2023.02)

(58) Field of Classification Search
None
See application file for complete search history.

(56) References Cited

U.S. PATENT DOCUMENTS 12,250,793 B2 3/2025 Sun et al.
2016/0027718 A1* 1/2016 Park .................. H10K 59/8794 165/80.3
2016/0120068 A1 4/2016 Tien et al.
2018/0061734 A1 3/2018 Lee et al.
(Continued)

FOREIGN PATENT DOCUMENTS

CN 103254830 A 8/2013
CN 204408838 U 6/2015
(Continued)

*Primary Examiner* — Daniel Whalen
(74) *Attorney, Agent, or Firm* — Fish & Richardson P.C.

(57) ABSTRACT

An electronic device includes a housing, a buffer component is connected to the housing, a first electronic element is located on a side that is of the buffer component and that is away from the housing, and a second electronic element is located on a side that is of the housing and that is away from the buffer component. The buffer component has a recess, and at least a part of a front projection of the second electronic element in a thickness direction of the electronic device falls within a front projection of the recess.

11 Claims, 5 Drawing Sheets

(56) References Cited

U.S. PATENT DOCUMENTS

| | | | |
|---|---|---|---|
| 2018/0207901 A1 | 7/2018 | Tien et al. | |
| 2020/0060043 A1 | 2/2020 | Lee et al. | |
| 2021/0135378 A1 | 5/2021 | Cho et al. | |
| 2021/0144884 A1 | 5/2021 | Mou et al. | |
| 2022/0061195 A1 | 2/2022 | Lee et al. | |
| 2022/0338341 A1 | 10/2022 | Hong et al. | |
| 2022/0376202 A1 | 11/2022 | Yang et al. | |
| 2023/0065633 A1 | 3/2023 | Wilson et al. | |
| 2023/0079122 A1 | 3/2023 | Junjae et al. | |
| 2023/0326829 A1 | 10/2023 | Zhao et al. | |

FOREIGN PATENT DOCUMENTS

| | | | |
|---|---|---|---|
| CN | 205071567 U | 3/2016 | |
| CN | 105828571 A | 8/2016 | |
| CN | 206402612 U | 8/2017 | |
| CN | 107768331 A | 3/2018 | |
| CN | 107969082 A | 4/2018 | |
| CN | 108770291 A | 11/2018 | |
| CN | 208111428 U | 11/2018 | |
| CN | 106817880 B | 5/2019 | |
| CN | 110278688 A * | 9/2019 | ......... H05K 7/20518 |
| CN | 110740619 A | 1/2020 | |
| CN | 111372433 A | 7/2020 | |
| CN | 111465280 A | 7/2020 | |
| CN | 111867342 A | 10/2020 | |
| CN | 112351662 A | 2/2021 | |
| CN | 112804851 A | 5/2021 | |
| CN | 113115569 A | 7/2021 | |
| CN | 113290958 A | 8/2021 | |
| CN | 114068438 A | 2/2022 | |

* cited by examiner

ELECTRONIC DEVICE COMPRISING RECESS IN BUFFER COMPONENT FOR REMOVING HEAT GENERATED BY ELECTRONIC COMPONENTS

CROSS-REFERENCE TO RELATED APPLICATIONS

This application is a national stage of International Application No. PCT/CN2022/115243, filed on Aug. 26, 2022, which claims priority to Chinese Patent Application No. 202111062755.0 filed on Sep. 10, 2021. The disclosures of both of the aforementioned application are hereby incorporated by reference in their entireties.

TECHNICAL FIELD

This application relates to the field of communications device technologies, and in particular, to an electronic device.

BACKGROUND

With development of technologies, electronic devices such as mobile phones and tablet computers have become electronic devices commonly used by people. When the electronic device is in use, heat generated by second electronic elements such as a motherboard and a chip component is transferred to a screen through a buffer foam. Consequently, a temperature at a corresponding position of the screen rises, affecting user experience.

SUMMARY

To resolve the problem in the background, this application is intended to provide an electronic device, to alleviate a problem that heat generated by different electronic elements of an electronic device affects each other in the conventional technology.

This application provides an electronic device. The electronic device includes:

a housing;

a first electronic element;

a second electronic element; and a buffer component, where the buffer component is connected to the housing, the first electronic element is located on a side that is of the buffer component and that is away from the housing, and the second electronic element is located on a side that is of the housing and that is away from the buffer component, where a recess is disposed in the buffer component, and at least a part of a front projection of the second electronic element in a thickness direction of the electronic device falls within a front projection of the recess in the thickness direction of the electronic device.

Disposing the recess can reduce a direct or an indirect contact area between the buffer component and the first electronic element and/or a direct or an indirect contact area between the buffer component and the second electronic element, to reduce heat transfer efficiency of a region that is of the buffer component and that corresponds to the second electronic element, thereby reducing a possibility that a local temperature of the first electronic element is relatively high, reducing impact of heating of the first electronic element on a sense of touch, and improving user experience.

In a possible implementation, the recess includes a first recess, the first recess is located on a side that is of the buffer component and that faces the second electronic element, and the recess is recessed away from the second electronic element.

Disposing the recess on the side that is of the buffer component and that faces the second electronic element can reduce a contact area between the buffer component and the second electronic element, to reduce heat transfer efficiency.

In a possible implementation, the recess further includes a second recess, and the second recess is located on a side that is of the buffer component and that is away from the second electronic element.

Disposing two recesses can reduce contact areas between the buffer component and both the first electronic element and the second electronic element, to reduce a possibility that interference occurs because heat is transferred between the first electronic element and the second electronic element.

In a possible implementation, the recess is a through-hole, and the through-hole penetrates the buffer component in the thickness direction of the electronic device.

The through-hole is disposed, so that a region that is of the buffer component and that corresponds to the electronic element is not in direct or indirect contact with the electronic element. Because air has a better heat insulation capability, disposing the through-hole can reduce heat transfer efficiency of the region, thereby reducing a possibility of transferring heat to a screen component.

In a possible implementation, a plurality of through-holes are disposed in the buffer component.

Disposing the plurality of through-holes can further reduce heat transfer efficiency.

In a possible implementation, in the thickness direction of the electronic device, a depth of the recess is m, and a thickness of the buffer component is n, where $0<m\leq n$.

A corresponding recess depth may be set based on an actual heat insulation effect.

In a possible implementation, a heat insulation material is disposed in the recess, and heat transfer efficiency of the heat insulation material is less than heat transfer efficiency of the buffer component.

Disposing the heat insulation material can further reduce heat transfer efficiency.

In a possible implementation, an adhesive is disposed between a sidewall of the recess and the heat insulation material, and the heat insulation material is bonded to the sidewall of the recess.

Disposing the adhesive can improve stability of disposing the heat insulation material.

In a possible implementation, the heat insulation material fills the entire recess, or the heat insulation material is of a grid structure.

Disposing the heat insulation material in a grid structure can reduce an amount of heat insulation materials while achieving a heat insulation function, to reduce costs and better meet an actual use requirement.

In a possible implementation, at least a part of the heat insulation material is one or more of a heat insulation member, a heat insulation aerogel, a glass fiber wool, asbestos, a rock wool, a silicate, ceramic fiber paper, and a vacuum plate.

Disposing the foregoing material can further reduce heat transfer efficiency of a corresponding region.

In a possible implementation, the front projection of the recess in the thickness direction of the electronic device includes the front projection of the second electronic element in the thickness direction of the electronic device.

A projected area of the recess is greater than a projected area of the electronic element, so that a heat insulation capability of the recess is improved, and a possibility that heat generated by the electronic element is transferred to a screen component through contact heat transfer is reduced.

In a possible implementation, the electronic device further includes a first thermally conductive part, and heat transfer efficiency of the first thermally conductive part in the thickness direction of the electronic device is less than heat transfer efficiency of the first thermally conductive part in a length direction and/or a width direction of the electronic device; and the first thermally conductive part is mounted on a side that is of the housing and that faces the second electronic element.

Disposing the first thermally conductive part between the housing and the electronic element can bring heat generated by the electronic element away from the electronic element in a timely manner, to reduce impact of heat on working of the electronic element.

In a possible implementation, the electronic device further includes a second thermally conductive part, the second thermally conductive part is located on a side that is of the buffer component and that is away from the first electronic element, and heat transfer efficiency of the second thermally conductive part in a length direction and/or a thickness direction of the electronic device is greater than heat transfer efficiency in the thickness direction of the electronic device.

The second thermally conductive part is disposed, so that heat is transferred in the length direction and/or the width direction of the electronic device, and a possibility of heat transfer in the thickness direction is reduced, thereby reducing a possibility that heat generated by the second electronic element is transferred to the first electronic element.

In a possible implementation, the electronic device further includes a shielding part, the shielding part is located on a side that is of the housing and that faces the second electronic element, the shielding part has a mounting cavity, and the second electronic element is located in the mounting cavity.

Disposing the shielding part can reduce impact of another factor on the second electronic element.

In a possible implementation, a third thermally conductive part is disposed on an inner wall of the mounting cavity, the third thermally conductive part protrudes toward the inside of the mounting cavity, and at least a part of the thermal interface material is in contact with the second electronic element.

Using a thermal material as the shielding part can help transfer heat generated by the electronic element to the outside in a timely manner, to reduce a possibility of heat accumulation near the electronic element.

In a possible implementation, the third thermally conductive part and the shielding part are integrally formed.

Generally, a metal material such as stainless steel may be used as the shielding part. Because the metal material has a good thermal conduction capability, the metal material may be used as the third thermally conductive part to transfer heat emitted by the second electronic element, to reduce heat accumulation near the second electronic element.

This application provides an electronic device. The electronic device includes a housing, a buffer component is connected to the housing, a first electronic element is located on a side that is of the buffer component and that is away from the housing, and a second electronic element is located on a side that is of the housing and that is away from the buffer component. The buffer component has a recess, and at least a part of a front projection of the second electronic element in a thickness direction of the electronic device falls within a front projection of the recess. Disposing the recess can reduce a direct or an indirect contact area between the buffer component and the first electronic element and/or a direct or an indirect contact area between the buffer component and the second electronic element, to reduce heat transfer efficiency of a corresponding region of the buffer component and reduce heat transfer efficiency of the electronic device in the thickness direction, thereby making heat more uniform in a non-thickness direction, reducing a possibility that a local temperature of the first electronic element is relatively high, and improving heat experience of a user.

It should be understood that the foregoing general descriptions and the following detailed descriptions are merely examples, and cannot limit this application.

REFERENCE NUMERALS

1—Housing;
  11—Rear cover;
2—First electronic element;
  21—Glass cover plate;
  22—Display component;
3—Second electronic element;
4—Buffer component;
  41—Recess;
    411—First recess;
    412—Second recess;

42—Heat insulation material;

5—First thermally conductive part;

6—Shielding part;

7—Second thermally conductive part;

8—Third thermally conductive part; and

9—Circuit board.

The accompanying drawings herein are incorporated into the specification and constitute a part of the specification, illustrate embodiments that conform to this application, and are used together with the specification to explain the principles of this application.

DESCRIPTION OF EMBODIMENTS

To better understand the technical solutions of this application, the following describes embodiments of this application in detail with reference to the accompanying drawings.

With development of technologies, electronic devices such as mobile phones and tablet computers have become common communications devices in people's daily life. When the electronic device is in use, load of electronic elements such as a motherboard and a chip increases, heat generated by the electronic elements increases, and the heat is transferred to a mobile phone screen through a middle frame and a buffer foam. Consequently, a local temperature of the mobile phone screen rises, affecting a sense of touch of a user. In addition, when temperature control software and a temperature control program inside the electronic device detect that a temperature of the screen is relatively high, underclocking processing is performed on an electronic element such as a central processing unit, causing the electronic device to be stuck and affecting product performance.

In view of this, embodiments of this application provide an electronic device, to alleviate a problem that heat generated by different electronic elements of an electronic device affects each other in the conventional technology.

Figure 1:
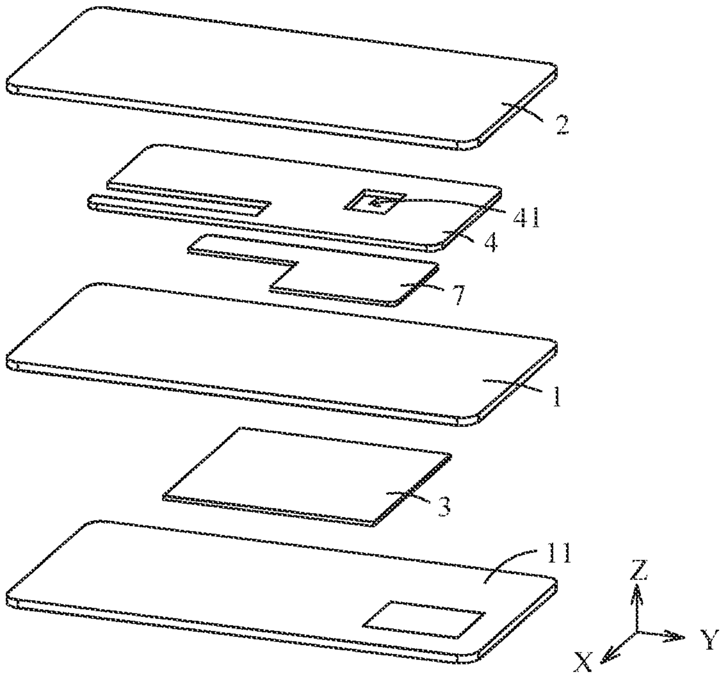
FIG. 1 is an exploded diagram of an electronic device according to this application.

As shown in FIG. 1, a Z-axis represents a thickness direction of an electronic device, an X-axis represents a width direction of the electronic device, and a Y-axis represents a length direction of the electronic device. An embodiment of this application provides an electronic device. The electronic device may be a mobile terminal or a fixed terminal with a display screen, for example, a mobile phone, a tablet computer (portable android device, PAD), a personal digital assistant (personal digital assistant, PDA), a notebook computer, a handheld device with a wireless communications function, a computing device, a vehicle-mounted device, a wearable device, a virtual reality (virtual reality, VR) terminal device, an augmented reality (augmented reality, AR) terminal device, a wireless terminal in industrial control (industrial control), a wireless terminal in self-driving (self driving), a wireless terminal in telemedicine (remote medical), a wireless terminal in a smart grid (smart grid), a wireless terminal in transportation safety (transportation safety), a wireless terminal in a smart city (smart city), a wireless terminal in a smart home (smart home), or the like. The electronic device includes a housing 1, a first electronic element 2, a second electronic element 3, and a buffer component 4. The housing 1 may be a middle frame of the electronic device, and the housing 1 further includes a rear cover 11.

In this application, the first electronic element 2 may be a display screen of the electronic device, and be configured to display an image, a video, or the like. The display screen includes a display panel. The display panel may be a liquid crystal display (liquid crystal display, LCD), an organic light-emitting diode (organic light-emitting diode, OLED), an active-matrix organic light emitting diode (active-matrix organic light emitting diode, AMOLED), a flexible light-emitting diode (flex light-emitting diode, FLED), a mini-LED, a microLED, a micro-OLED, a quantum dot light emitting diode (quantum dot light emitting diodes, QLED), or the like. In some embodiments, the electronic device may include one or more display screens. It may be understood that the first electronic element 2 may be another electronic component that extends along an XY plane. This is not limited in this application.

The second electronic element 3 may be a processor. The processor may include one or more processing units. The processor may include an application processor (application processor, AP), a modem processor, a graphics processing unit (graphics processing unit, GPU), an image signal processor (image signal processor, ISP), a controller, a video codec, a digital signal processor (digital signal processor, DSP), a baseband processor, a neural-network processing unit (neural-network processing unit, NPU), and/or the like Different processing units may be independent components, or may be integrated into one or more processors. It may be understood that the second electronic element 3 may be another electronic component that extends along the XY plane, for example, another chip disposed on a motherboard of the electronic device. This is not limited in this application.

The buffer component 4 may use a material such as a buffer foam, and a high molecular polymer may foam to form the buffer foam. In terms of a material type of a substrate, the buffer foam is mainly classified into polypropylene (polypropylene, PP), polyethylene (polyethylene, PE), polyurethane (polyurethane. PU), and the like, and the buffer foam has a pore inside. In terms of a structure, the buffer foam is mainly classified into an open-hole structure, a half-open-hole structure, and a closed-hole structure. When being applied to the electronic device, the buffer component 4 mainly provides functions of sealing, compression, buffer, support, and the like. For example, the buffer component 4 may be configured to protect the first electronic element 2. When the electronic device falls or the first electronic element 2 is impacted, the buffer foam may be configured to absorb the impact to achieve the buffer function, so that a possibility that the first electronic element 2 is damaged is reduced.

Figure 2:
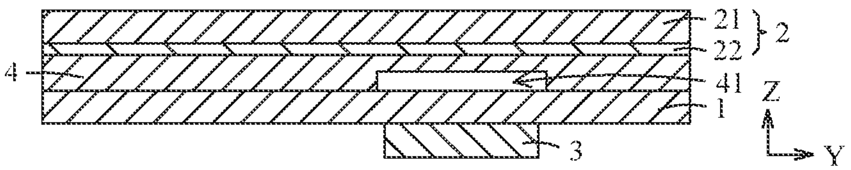
FIG. 2 is a schematic diagram of a structure of a first embodiment of an electronic device according to this application.

As shown in FIG. 1, the buffer component 4 is connected to the housing 1, the first electronic element 2 is located on a side that is of the buffer component 4 and that is away from the housing 1, and the second electronic element 3 is located on a side that is of the housing 1 and that is away from the buffer component 4, in other words, the buffer component 4 is located between the first electronic element 2 and the housing 1, and the housing 1 is located between the buffer component 4 and the second electronic element 3. When being mounted, the buffer component 4 may be fastened to the housing 1 through bonding or the like, or may be clamped and fastened to the housing 1 by using the first electronic element 2. The buffer component 4 may be of an entire-layer structure, that is, cover a surface of a side that is of the first electronic element 2 and that faces the housing 1, or may be of an annular structure, that is, be disposed, along the edge of the first electronic element 2, on a side that is of the first electronic element 2 and that faces the housing 1. A recess 41 is disposed in the buffer component 4. The second electronic element 3 such as the motherboard or a chip may be located on a side that is of the housing 1 and that is away from the first electronic element 2. As shown in FIG. 2, a surface of a side that is of the first electronic element 2 and that faces the buffer component 4 is used as a projection plane, in other words, the projection plane is parallel to the XY plane in FIG. J. When a screen component is of a curved-screen structure, the projection plane may be a plane on which a lower end face (a lower end face in a thickness direction Z) of a curved screen is located, and at least a part of a front projection of the second electronic element 3 in the thickness direction Z of the electronic device falls within a projection range of the recess 41 in the thickness direction Z, or a front projection of the second electronic element 3 in the thickness direction Z of the electronic device completely falls within a projection range of the recess 41 in the thickness direction Z. In other words, an area of the recess 41 may be greater than an area of the second electronic element 3, so that the second electronic element 3 completely falls within the projection range of the recess 41, or an area of the recess 41 may be equal to or less than an area of the second electronic element 3, so that a part of the second electronic element 3 falls within the projection range of the recess 41.

A projected shape of the recess 41 on the projection plane may be a rectangle, a circle, a regular polygon, a polygon, or another irregular shape. In some possible embodiments, the recess 41 may be of a groove structure, in other words, the bottom is not penetrated. In other examples, the recess 41 may be of a through-hole structure. A depth of the recess 41 is m, and a thickness of the buffer component 4 is n. Specifically, $0<m\leq n$. When the buffer component 4 has the recess 41, a contact area can be reduced to reduce heat transfer efficiency.

Specifically, a ratio of the depth m of the recess 41 to the thickness n of the buffer component 4 may be 0.2, 0.4, 0.6, 0.8, or the like. In addition, heat transfer efficiency of air is less than heat transfer efficiency of the buffer foam. Therefore, a larger depth of the recess 41 indicates a stronger heat insulation capability of a region in which the recess 41 is located and leads to a further reduction in impact on the first electronic element 2 that is caused by heat emitted by the second electronic element 3.

It should be noted herein that provided that a relationship between the depth m of the recess 41 and the thickness n of the buffer component 4 can meet $0<m\leq n$, a heat insulation capability can be improved, and mutual heat transfer between the first electronic element 2 and the second electronic element 3 can be reduced. The foregoing ratios of m to n are merely relatively preferred solutions. In practice, a ratio of m to n may be designed based on an actual case, and the actual ratio of m to n includes but is not limited to the foregoing ratios.

In some possible implementations, the recess 41 may be filled with air, in other words, no heat insulation material may be additionally disposed in the recess 41. Because the air has relatively good heat insulation performance, heat insulation efficiency of the air is usually greater than that of the buffer component 4. Using the air for filling can reduce heat transfer efficiency of a region corresponding to the recess 41, in other words, reduce heat transfer efficiency of a region whose front projection in the thickness direction of the electronic device falls within the front projection range of the recess 41, thereby reducing heat transferred from the second electronic element 3 to the first electronic element 2. In other embodiments, a heat insulation material 42 may be disposed in the recess 41, and heat insulation efficiency of the heat insulation material 42 is greater than that of the buffer component 4, so that heat transferred from the second electronic element 3 to the first electronic element 2 is reduced.

The recess 41 is disposed in the buffer component 4, and the heat insulation material 42 (or a heat insulation medium) whose heat insulation efficiency is greater than that of the buffer component 4 is filled in the recess 41. The recess 41 can be used to form a heat insulation channel, and the heat insulation material 42 is filled in the heat insulation channel to further improve a heat insulation capability of the heat insulation channel, so that a possibility that heat generated by the second electronic element 3 is transferred to the first electronic element 2 through a region in which the heat insulation channel is located can be reduced, a possibility that a local temperature of the first electronic element 2 is relatively high can be reduced, and impact of screen heating on a sense of touch can be reduced when the first electronic element 2 is a screen component, thereby improving user experience and better meeting an actual use requirement.

Because the recess 41 is disposed in the buffer component 4, a possibility that heat generated by the second electronic element 3 is transferred to the first electronic element 2 is reduced, so that a possibility of underclocking the second electronic element 3 because temperature control software of the electronic device detects that a temperature of the first electronic element 2 is relatively high is reduced, thereby reducing a possibility that the electronic device is stuck and improving user experience.

In a possible implementation, the surface of the side that is of the first electronic element 2 and that faces the buffer component 4 is used as the projection plane, and the front projection of the recess 41 in the thickness direction Z of the electronic device includes the front projection of the second electronic element 3 in the thickness direction Z of the electronic device. A projected area of the recess 41 is greater than a projected area of the second electronic element 3, and covers all of the projection of the second electronic element 3. For example, when the area of the second electronic element 3 is 10 square centimeters, the area of the recess 41 may be 30 square centimeters to 40 square centimeters.

The projected area of the recess 41 is greater than the projected area of the second electronic element 3, so that the second electronic element 3 can fall within a region range of the recess 41, thereby implementing heat insulation by using the recess 41 and reducing a possibility of transferring heat to the first electronic element 2.

Figure 3:
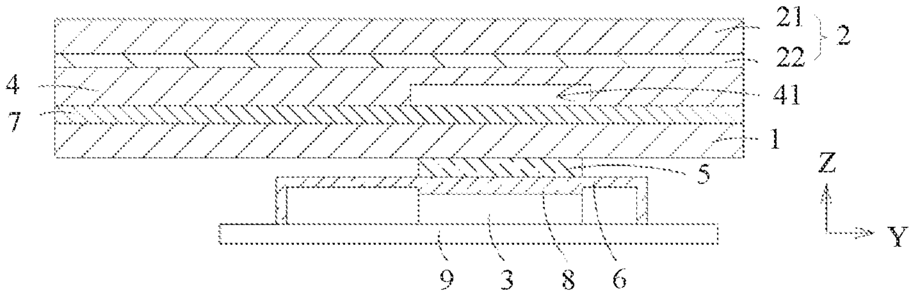
FIG. 3 is a schematic diagram of a structure of a second embodiment of an electronic device according to this application.

As shown in FIG. 3, in a possible implementation, the electronic device may include a first thermally conductive part 5, and heat transfer efficiency of the first thermally conductive part 5 in the thickness direction Z of the electronic device is less than heat transfer efficiency of the first thermally conductive part 5 in a length direction Y and/or a width direction X of the electronic device. The first thermally conductive part 5 is mounted on a side that is of the housing 1 and that faces the second electronic element 3.

The first thermally conductive part 5 may use a material with relatively high heat transfer efficiency, to absorb heat generated by the second electronic element 3, and transfer the heat to a side that is of the thermal material and that is away from a chip component. Such a design can help bring the heat generated by the second electronic element 3 away from the second electronic element 3 in a timely manner, to reduce a possibility that the electronic device is stuck because a frequency of the second electronic element 3 is reduced due to an excessively high temperature. In some possible embodiments, the first thermally conductive part 5 may use a graphite material such as graphene or artificial graphite. Because the graphite material has different performance in different directions and has an anisotropic characteristic, heat transfer efficiency is different in different directions. In practice, a first thermally conductive part 5 with lower heat transfer efficiency in the thickness direction Z of the electronic device and higher heat transfer efficiency in a non-thickness direction may be disposed, so that heat is transferred in a direction other than the thickness direction Z, a temperature of the first electronic element 2 is more uniform, and a possibility that a local temperature of the first electronic element 2 is excessively high is reduced. In other examples, the first thermally conductive part 5 may alternatively use a VC vapor chamber. A heat transfer medium channel in the VC vapor chamber is disposed in a direction parallel to the XY plane, so that heat transfer efficiency of the first thermally conductive part 5 in the thickness direction Z is less than heat transfer efficiency along the XY plane.

As shown in FIG. 3, in a possible implementation, the electronic device may further include a shielding part 6. The shielding part 6 may be a structure such as a shielding cover, and the shielding part 6 may use a material such as metal, for example, stainless steel. The shielding part 6 is located on a side that is of the buffer component 4 and that is away from the first electronic element 2. Specifically, the shielding part 6 may be located on the side that is of the housing 1 and that faces the second electronic element 3. The shielding part 6 has a mounting cavity, and at least a part of the motherboard of the electronic device is located in the mounting cavity, and the second electronic element 3 such as the chip is mounted in a circuit board 9, and is located in the mounting cavity. The shielding part 6 may be configured to shield the second electronic element 3 from interference of factors such as an external signal, a magnetic field, and radiation, so that working stability of the second electronic element 3 is improved. In addition, the metal material usually has a relatively good thermal conduction capability, and may be used to transfer heat, in other words, the shielding part 6 may be configured to transfer heat while achieving the shielding function. Specifically, the shielding part 6 may protrude toward the second electronic element 3, and a protruded part may be used as a third thermally conductive part 8, in other words, the third thermally conductive part 8 may be integrally formed on an inner wall of the mounting cavity when the shielding part 6 is processed. The third thermally conductive part 8 is configured to come into contact with the second electronic element 3 to absorb heat generated by the second electronic element 3.

In a possible implementation, the shielding part 6 may include an end cover and a mounting bracket. The bracket may use a material such as a copper-nickel alloy, a copper-nickel-zinc alloy, stainless steel, or a tin-plated steel strip, the end cover may use stainless steel, and the end cover is mounted on the circuit board 9 by using the mounting bracket, to protect the electronic element and shield the electronic element from an interference signal.

In a possible implementation, at least a part of the shielding part 6 is a thermal material. Because metal has a good thermal conduction capability in this application, the metal may be used as the thermal material.

Disposing the thermal material can enable the shielding part 6 to achieve the shielding function and also transfer heat generated by the second electronic element 3 to the outside in a timely manner.

Figure 4:
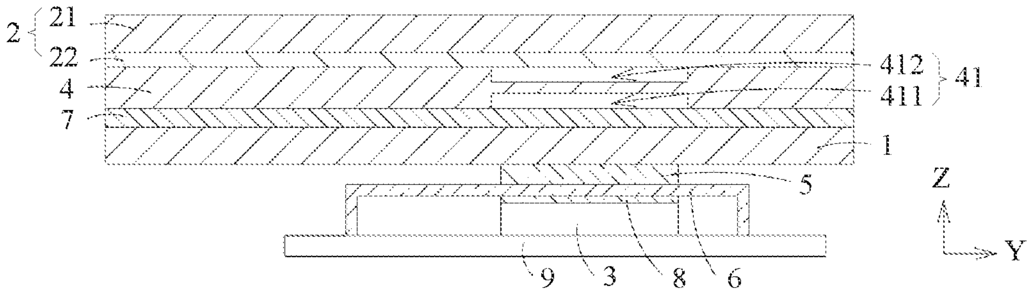
FIG. 4 is a schematic diagram of a structure of a third embodiment of an electronic device according to this application.

As shown in FIG. 4, in a possible implementation, the third thermally conductive part 8 may be separately disposed. For example, to improve heat transfer efficiency, a third thermally conductive part 8 may be further disposed between the shielding part 6 and the second electronic element 3, and at least a part of the third thermally conductive part 8 is in contact with the second electronic element 3. The third thermally conductive part 8 may be a thermal interface material (thermal interface material, TIM). For example, silicone grease may be applied between the shielding part 6 and the second electronic element 3. Because the silicone grease has good thermal conductivity, the silicon grease can absorb, in a timely manner, heat emitted by the second electronic element 3, and transfer the heat to the shielding part 6, and then the shielding part 6 transfers the heat to the outside, so that a possibility of heat accumulation near the second electronic element 3 is reduced.

Disposing the third thermally conductive part 8 helps bring heat generated by the second electronic element 3 away from the second electronic element 3 through contact heat transfer in a timely manner, to improve heat dissipation efficiency of the electronic device.

As shown in FIG. 3, in a possible implementation, the first electronic element 2 may be a screen component, the screen component may include a glass cover plate 21 and a display component 22, the display component 22 may be an OLED display component, and the glass cover plate 21 is located on a side that is of the display component 22 and that is away from the housing 1, and is configured to protect the display component 22. A second thermally conductive part 7 may be disposed between the buffer component 4 and the housing 1, and specifically, graphene, a graphite sheet, composite graphite, a copper foil, a VC, a heat pipe, or the like may be used. A specific characteristic or structure of the second thermally conductive part 7 may be the same as that of the first thermally conductive part 5 mentioned above. That is, heat transfer efficiency of the second thermally conductive part 7 in the length direction Y and/or the width direction X of the electronic device is greater than heat transfer efficiency of the second thermally conductive part 7 in the thickness direction Z. When heat generated by the second electronic element 3 is transferred to the second thermally conductive part 7 through the housing 1, the second thermally conductive part 7 can transfer the heat in the width direction X and/or the length direction Y of the electronic device, to reduce heat transfer in the thickness direction Z of the electronic device, promote heat to be transferred along the XY plane, and make heat more uniformly distributed, thereby reducing cases in which a local temperature of the electronic device is excessively high and improving user experience.

As shown in FIG. 3, in a possible implementation, the recess 41 may be located on a side that is of the buffer component 4 and that faces the second electronic element 3, and is recessed away from the second electronic element 3.

In such a design, an opening of the recess 41 can face the second electronic element 3, so that a possibility of contact heat transfer between the buffer component 4 and the second electronic element 3 is reduced, and heat transfer efficiency is reduced.

As shown in FIG. 4, in a possible implementation, the recess 41 includes a first recess 411 and a second recess 412. The first recess 411 is located on the side that is of the buffer component 4 and that faces the second electronic element 3, and the second recess 412 is located on the side that is of the buffer component 4 and that is away from the first electronic element 2. Specifically, a depth of the first recess 411 may be greater than or equal to a depth of the second recess 412. Generally, the first electronic element 2 is a screen component, the second electronic element 3 is a chip, and an amount of heat generated by the chip is relatively large. Therefore, a relatively large depth of the first recess 411 can reduce transfer of heat generated by the chip to a side on which the buffer component 4 is located, to reduce heat transfer to a side on which the first electronic element 2 is located.

Compared with the solution in which the depth of the first recess 411 may be greater than or equal to the depth of the second recess 412, a solution in which the depth of the second recess 412 is greater than the depth of the first recess 411 can also hinder heat transfer. However, because the depth of the first recess 411 is relatively small, a heat insulation capability is relatively poor, and there is a possibility that a small amount of heat generated by the second electronic element 3 is likely to be transferred to the buffer component 4 and be transferred to the first electronic element 2 through another region of the buffer component 4, that is, a region in which no recess 41 is disposed.

Disposing the first recess 411 and the second recess 412 can reduce direct contact areas or indirect contact areas between the buffer component 4 and both the second electronic element 3 and the first electronic element 2, to reduce heat transfer efficiency. The second recess 412 is used to further reduce a possibility of transferring heat to the first electronic element 2, so that heat propagates in the direction other than the thickness direction Z, thereby reducing a possibility that a local temperature of the first electronic element 2 is excessively high.

Figure 5:
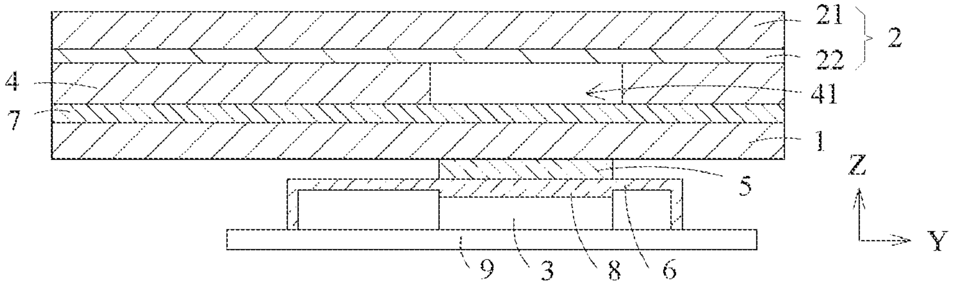
FIG. 5 is a schematic diagram of a structure of a fourth embodiment of an electronic device according to this application.

As shown in FIG. 5, in a possible implementation, the recess 41 is a through-hole, that is, in the thickness direction Z of the electronic device, the recess 41 completely penetrates the buffer component 4.

Disposing the recess 41 as a through-hole can reduce direct or indirect contact areas between both the second electronic element 3 and the first electronic element 2 and the buffer component 4, to reduce heat transfer efficiency and a possibility of transferring heat of the second electronic element 3 to the first electronic element 2.

Figure 6:
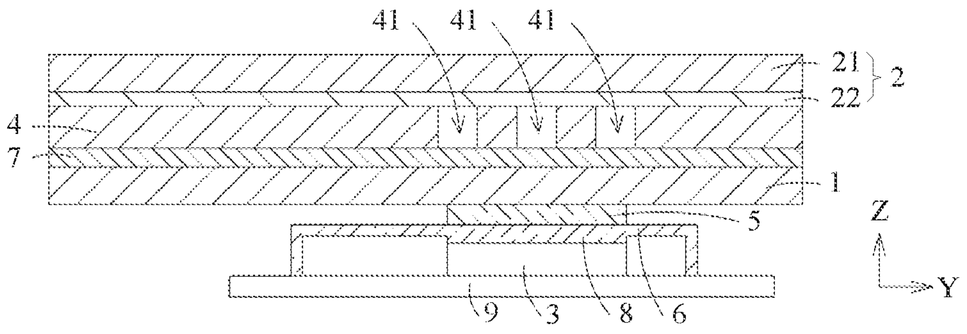
FIG. 6 is a schematic diagram of a structure of a fifth embodiment of an electronic device according to this application.

As shown in FIG. 6, in a possible implementation, a plurality of recesses 41 may be disposed in the buffer component 4. For example, a plurality of grooves or through-holes may be disposed on a same side of the buffer component 4, and the grooves or the through-holes are arranged according to a preset rule. For example, a plurality of rows of grooves/through-holes may be disposed, and a plurality of grooves/through-holes may be disposed in each row. In other words, the grooves or the through-holes are disposed in a form of an array. For example, the array may be of 2*2, 2*3, 2*4, 3*3, or 3*4. It may be understood that the foregoing preset rule may be set based on a specific case, and a quantity of arrays is not limited in this application.

Figure 7:
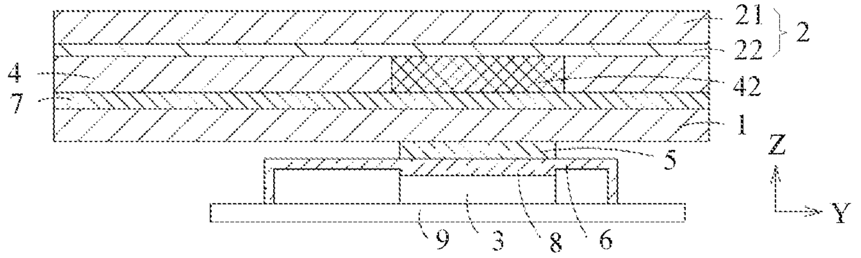
FIG. 7 is a schematic diagram of a structure of a sixth embodiment of an electronic device according to this application.

As shown in FIG. 7, in a possible implementation, the recess 41 may be filled with a heat insulation material 42 or an air layer, and heat transfer efficiency of the heat insulation material 42 is less than heat transfer efficiency of the buffer component 4. The beat insulation material 42 may be a beat insulation aerogel, asbestos, a rock wool, a vacuum plate, ceramic fiber paper, a glass fiber wool, or the like, may be a material containing a sulphate such as an aluminum sulfate, or may be s heat insulation member such as a heat insulation film, a heat insulation wool, heat insulation paper, or a heat insulation gasket. The heat insulation material 42 may be one or a combination of a plurality of the foregoing materials.

Because the air has a relatively good heat insulation capability, and using the air is less costly than filling another heat insulation material 42, only the recess 41 may be disposed in the buffer component 4, and no other heat insulation material 42 may be additionally filled.

Specifically, the heat insulation material may be a heat insulation aerogel. The heat insulation aerogel has a relatively good heat insulation capability, so that a possibility that a local temperature of the first electronic element 2 is relatively high due to impact of the second electronic element 3 is reduced. In addition, quality of the heat insulation aerogel is relatively small, and a heat insulation effect of the heat insulation aerogel is better than that of a heat insulation gasket of a same thickness, in other words, a relatively small amount of heat insulation aerogels (or a relatively thin heat insulation aerogel) may be used to achieve a relatively good heat insulation effect Therefore, when the heat insulation aerogel is applied to an electronic device such as a mobile phone, a tablet computer, or a notebook computer, a weight of the electronic device is reduced, the electronic device is convenient for a user to carry, and an actual use requirement is better met while a heat insulation capability is improved.

Specifically, in a possible implementation, an adhesive may be disposed on an inner wall of the recess 41, and the heat insulation material 42 may be bonded to the inner wall of the recess 41 by using the adhesive. Specifically, the adhesive may be a heat insulation adhesive, so that heat transfer efficiency is further reduced.

Figure 8:
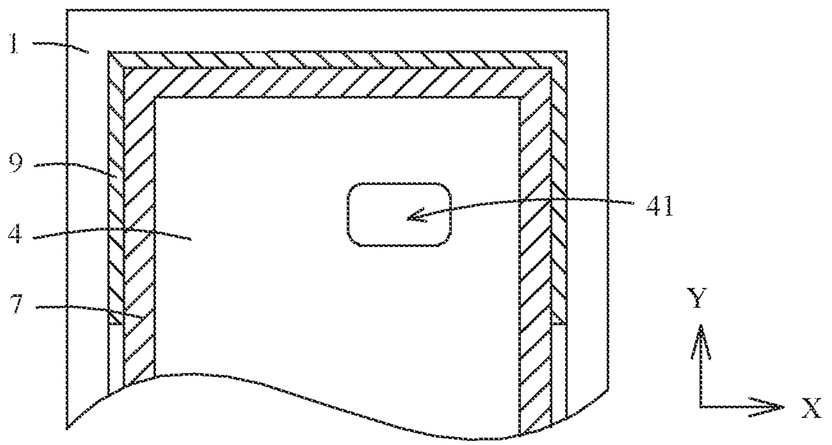
FIG. 8 is a schematic diagram of a structure of a seventh embodiment of an electronic device according to this application.
Figure 9:
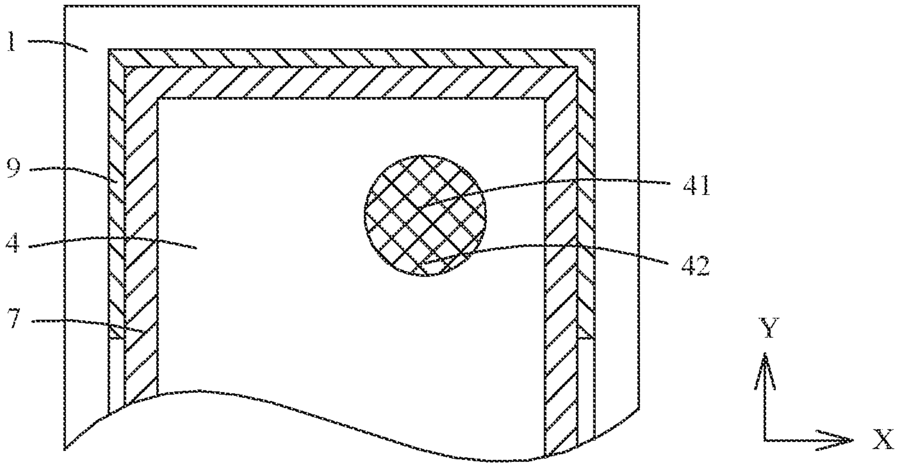
FIG. 9 is a schematic diagram of a structure of an eighth embodiment of an electronic device according to this application.
Figure 10:
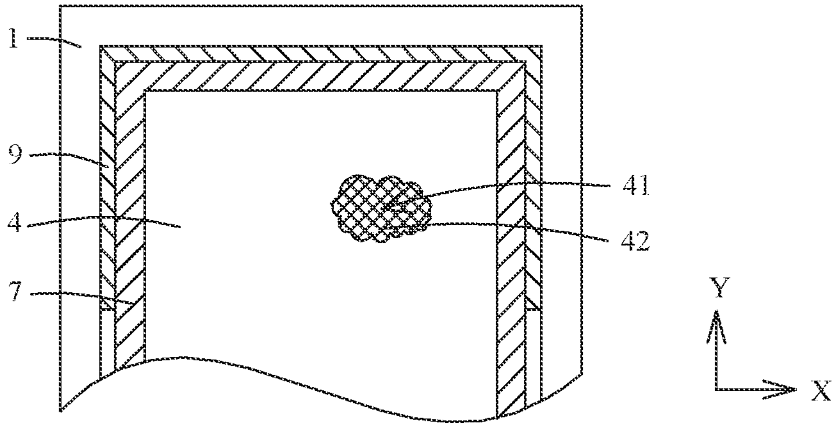
FIG. 10 is a schematic diagram of a structure of a ninth embodiment of an electronic device according to this application.

As shown in FIG. 8, FIG. 9, and FIG. 10, in a possible implementation, the recess 41 may be a rectangular recess, a circular recess, a recess of a regular polygon, a recess of a polygon, a recess of another irregular shape, or the like. A specific structure may be designed based on an actual requirement.

Disposing the heat insulation material 42 in the recess 41 can further reduce heat transfer efficiency of a region that is of the buffer foam and that corresponds to the second electronic element 3 such as the motherboard or the chip, to hinder heat transfer to a location of the first electronic element 2, thereby reducing a possibility that a local temperature of the first electronic element 2 is relatively high.

A structure of the recess 41 is designed based on an actual case, for example, a location, a shape, or the like of another surrounding element, so that a location, the depth, and the area of the recess 41 are adjusted, and the second electronic element 3 can completely fall within the projection range of the recess 41, or a part of the second electronic element 3 can fall within the projection range of the recess 41. When the second electronic element 3 is an element that generates a relatively large amount of heat, the area and the depth of the recess 41 may be increased. When the second electronic element 3 is an element that generates a relatively small amount of heat, the area or the depth of the recess 41 may be reduced to reduce a quantity of recesses 41 of the buffer component 4 or a volume of the recess 41, thereby reducing impact of the recess 41 on a buffer effect of the buffer component 4, reducing a possibility that the first electronic element 2 and/or the second electronic element 3 are or is damaged, and better meeting an actual use requirement.

In a possible implementation, the heat insulation material 42 may fill space of the entire recess 41.

The heat insulation material 42 fills the space of the entire recess 41, so that heat transfer efficiency of the region can be reduced, thereby reducing a possibility that heat generated by the second electronic element 3 is transferred to the first electronic element 2.

Figure 11:
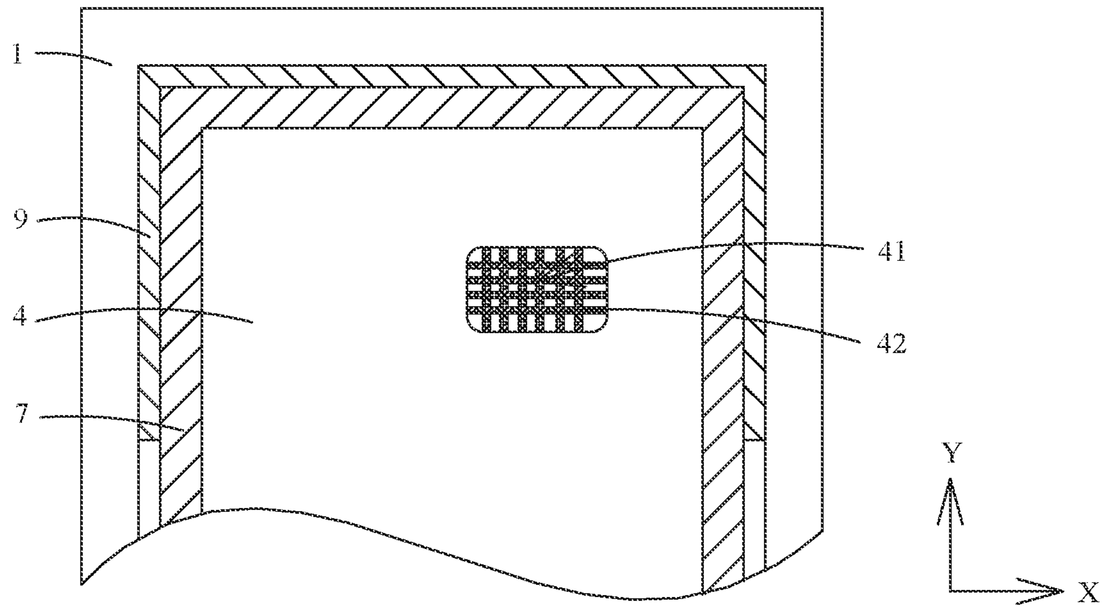
FIG. 11 is a schematic diagram of a structure of a tenth embodiment of an electronic device according to this application.
Figure 12:
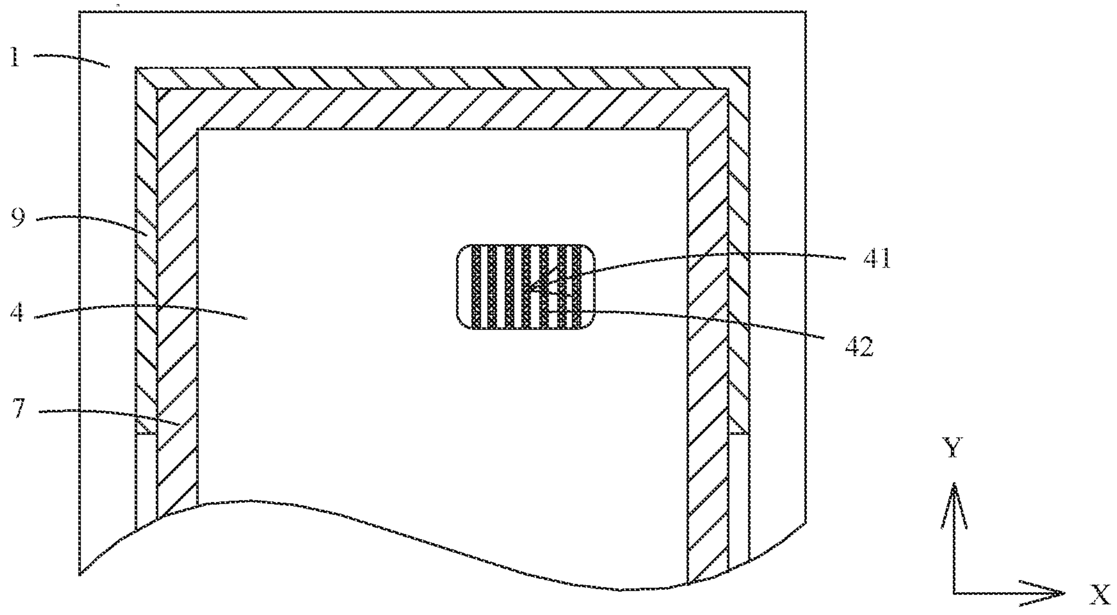
FIG. 12 is a schematic diagram of a structure of an eleventh embodiment of an electronic device according to this application.

As shown in FIG. 11 and FIG. 12, in a possible implementation, the heat insulation material 42 may be of a grid structure. Specifically, the grid structure may be a crossshaped grid, a bar-shaped structure, or the like. Because the air also has a relatively good heat insulation function, an area of the heat insulation material 42 may be appropriately reduced, so that costs can be reduced and actual production requirement can be better met while a heat insulation effect is achieved.

An embodiment of this application provides an electronic device. The electronic device includes a housing 1, a buffer component 4 is connected to the housing 1, a first electronic element 2 is located on a side that is of the buffer component 4 and that is away from the housing 1, and a second electronic element 3 is located on a side that is of the housing 1 and that is away from the buffer component 4. The buffer component 4 has a recess 41, and at least a part of a front projection of the second electronic element 3 in a thickness direction of the electronic device falls within a front projection of the recess. Disposing the recess 41 can reduce a direct or an indirect contact area between the buffer component 4 and the first electronic element 2 and/or a direct or an indirect contact area between the buffer component 4 and the second electronic element 3, to reduce heat transfer efficiency of a corresponding region of the buffer component 4 and reduce heat transfer efficiency of the electronic device in the thickness direction, thereby making heat more uniform in a non-thickness direction, reducing a possibility that a local temperature of the first electronic element 2 is relatively high, and improving heat experience of a user.

Embodiments of this application are described with reference to the accompanying drawings. However, this application is not limited to the foregoing specific implementations. The foregoing specific implementations are merely examples, but are not limiting. A person of ordinary skill in the art may make many forms without departing from the objective and the scope of the claims of this application, and these forms fall within the protection scope of this application.

It should be noted that a part of the documents of the present patent contains content protected by copyright. The copyright owner reserves the right except for making copies of the patent documents of the China National Intellectual Property Administration or the recorded content of the patent documents.

What is claimed is:

1. An electronic device, comprising:

a housing;

a first electronic element;

a second electronic element; and a buffer component connected to the housing, wherein the buffer component has a first side and a second side, the first side of the buffer component is opposite to the second side of the buffer component, the first side of the buffer component is a side that faces the housing, and the second side of the buffer component is a side that is away from the housing, and the housing has a first side and a second side, the first side of the housing is opposite to the second side of the housing, the first side of the housing is a side that faces the buffer component, and the second side of the housing is a side that is away from the buffer component;

wherein the first electronic element is located on the second side of the buffer component, and the second electronic element is located on the second side of the housing, and the buffer component and the housing are both located between the first electronic element and the second electronic element;

wherein a recess is disposed in the buffer component, and in a thickness direction of the electronic device, a part of a front projection of the second electronic element falls within a front projection of the recess;

wherein the recess comprises a first recess, the first recess is located on a side that is of the buffer component and that faces the second electronic element, and the recess is recessed away from the second electronic element; and wherein in the thickness direction of the electronic device, a depth of the recess is m, and a thickness of the buffer component is n, wherein $0<m\leq n$, wherein a ratio of the depth m of the recess to the thickness n of the buffer component is one of 0.2, 0.4, 0.6, and 0.8.

2. The electronic device of claim 1, wherein the recess further comprises a second recess, and the second recess is located on a side that is of the buffer component and that is away from the second electronic element.

3. The electronic device of claim 1, wherein the front projection of the recess in the thickness direction of the electronic device comprises the front projection of the second electronic element in the thickness direction of the electronic device.

4. The electronic device of claim 1, wherein the electronic device further comprises a first thermally conductive part, and heat transfer efficiency of the first thermally conductive part in the thickness direction of the electronic device is less than heat transfer efficiency of the first thermally conductive part in a length direction of the electronic device; and wherein the first thermally conductive part is mounted on the second side of the housing.

5. The electronic device of claim 1, wherein the electronic device further comprises a first thermally conductive part, and heat transfer efficiency of the first thermally conductive part in the thickness direction of the electronic device is less than heat transfer efficiency of the first thermally conductive part in a width direction of the electronic device; and wherein the first thermally conductive part is mounted on the second side of the housing.

6. The electronic device of claim 1, wherein the electronic device further comprises a second thermally conductive part, the second thermally conductive part is located on the first side of the buffer component, and heat transfer efficiency of the second thermally conductive part in a length direction of the electronic device is greater than heat transfer efficiency in the thickness direction of the electronic device.

7. The electronic device of claim 1, wherein the electronic device further comprises a second thermally conductive part, the second thermally conductive part is located on the first side of the buffer component, and heat transfer efficiency of the second thermally conductive part in a width direction of the electronic device is greater than heat transfer efficiency in the thickness direction of the electronic device.

8. The electronic device of claim 1, wherein the electronic device further comprises a shielding part with a mounting cavity; wherein the shielding part is located on the second side of the housing, and the second electronic element is located in the mounting cavity.

9. The electronic device of claim 8, wherein a third thermally conductive part is disposed on an inner wall of the mounting cavity, the third thermally conductive part protrudes toward the inside of the mounting cavity, and a part of the third thermally conductive part is in contact with the second electronic element.

10. The electronic device of claim 9, wherein the third thermally conductive part and the shielding part are integrally formed.

11. The electronic device of claim 1, wherein the first electronic element is a display of the electronic device, and the second electronic element is a processor.

* * * * *